United States Patent [19]

Helgeland et al.

[11] 4,350,560
[45] Sep. 21, 1982

[54] APPARATUS FOR AND METHOD OF HANDLING CRYSTALS FROM CRYSTAL-GROWING FURNACES

[75] Inventors: Walter Helgeland, Lexington; Alex Teverovsky, Concord, both of Mass.; Kenneth H. Kerwin, II, Londonderry, N.H.; Carl P. Chartier, Danvers, Mass.

[73] Assignee: Ferrofluidics Corporation, Nashua, N.H.

[21] Appl. No.: 298,242

[22] PCT Filed: May 19, 1981

[86] PCT No.: PCT/US81/00668
§ 371 Date: Aug. 7, 1981
§ 102(e) Date: Aug. 7, 1981

[51] Int. Cl.³ .............................................. C30B 15/32
[52] U.S. Cl. .................... 156/617 SP; 156/DIG. 98; 422/249; 269/17; 269/35; 269/287; 414/210; 414/349; 414/391; 414/399
[58] Field of Search ......... 156/617 SP, 620, DIG. 98; 269/17, 35, 287; 422/248, 249; 414/210, 349, 391, 392, 399, 495; 13/DIG. 1; 75/65 ZM

[56] References Cited

U.S. PATENT DOCUMENTS

| 2,975,036 | 3/1961 | Taylor et al. ............... 156/617 SP |
| 3,940,577 | 2/1976 | Christofer ............................ 414/210 |
| 3,961,906 | 6/1976 | Keller ......................... 156/DIG. 98 |
| 3,994,690 | 11/1976 | Defosse ....................... 156/617 SP |
| 4,045,183 | 8/1977 | Barowski et al. .......... 156/DIG. 98 |
| 4,258,009 | 3/1981 | DeLeon et al. ............ 156/DIG. 98 |

FOREIGN PATENT DOCUMENTS

| 1519901 | 2/1970 | Fed. Rep. of Germany ... 156/DIG. 98 |
| 2712506 | 9/1978 | Fed. Rep. of Germany ... 156/DIG. 98 |

Primary Examiner—Gregory N. Clements
Attorney, Agent, or Firm—Richard P. Crowley

[57] ABSTRACT

An apparatus for and a method of handling grown crystal ingots from a crystal-growing furnace, which apparatus and method include: lifting and moving an upper crystal chamber with the crystal supported therein to one side of the furnace; and gently lowering the crystal into a lower crystal chamber positioned beneath the upper crystal chamber and on a wheeled vehicle, which permits ease in removal and transport of hot heavy crystals with minimum damage or fracture.

17 Claims, 4 Drawing Figures

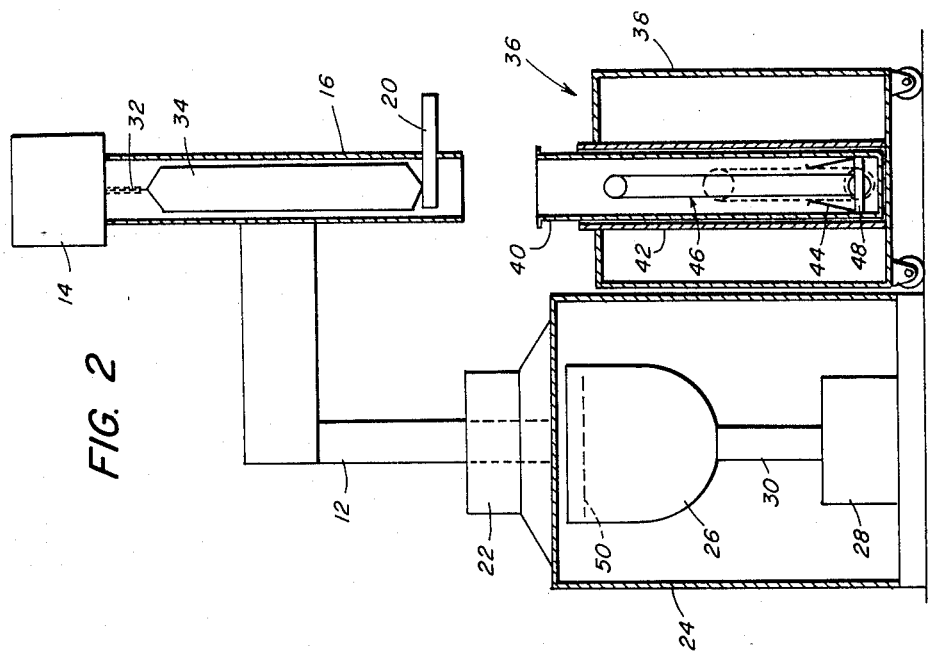
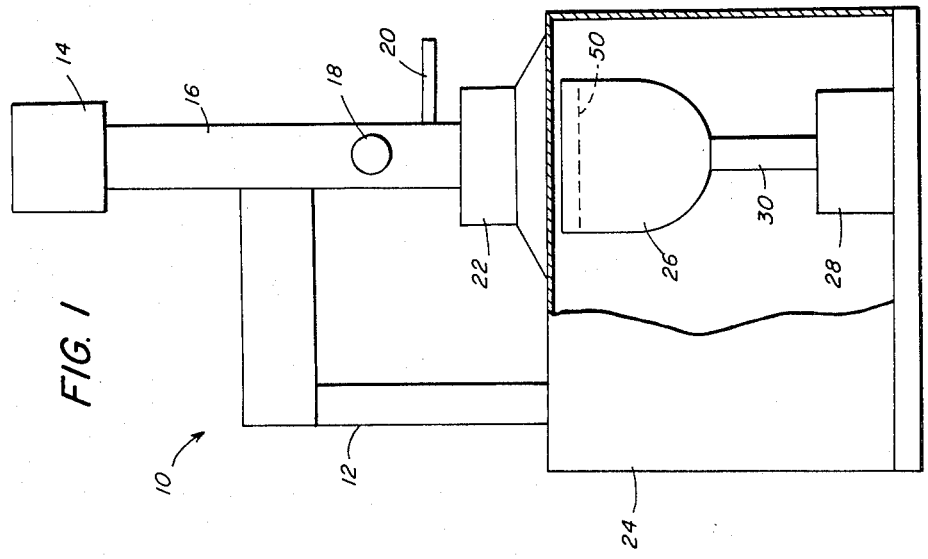

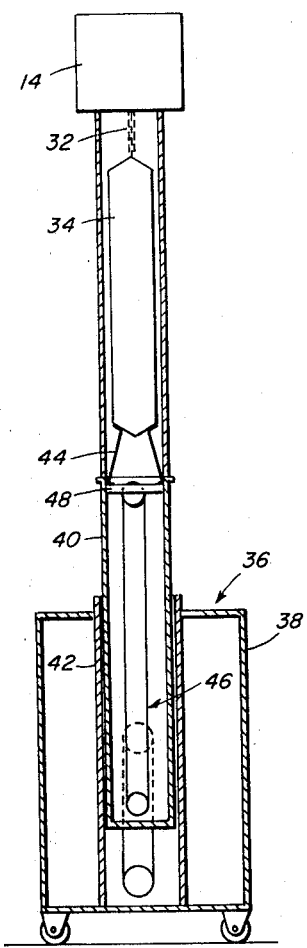
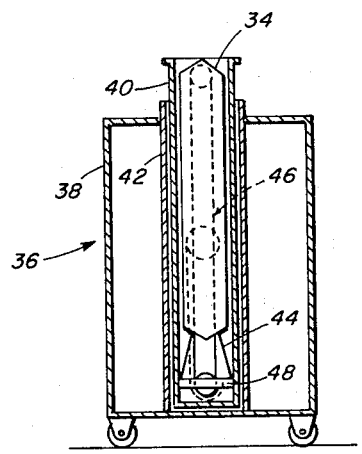
FIG. 3
FIG. 4

APPARATUS FOR AND METHOD OF HANDLING CRYSTALS FROM CRYSTAL-GROWING FURNACES

BACKGROUND OF THE INVENTION

Crystals, such as single crystal ingots of silicon, are grown by the Czochralski method in a crystal-growing furnace, which usually includes a crucible containing a melt, the crucible being within a contaminant-free, low-pressure chamber, with a pulling-head mechanism for drawing the crystal from the melt along a vertical axis at a steady rate, while providing relative rotation about the vertical axis for the growing crystal with respect to the melt. The method is carried out in a sealed, vacuum-type chamber in which the crucible is placed, and typically the housing includes a generally elongated chamber directly above the crucible, as a crystal-growing chamber of a crystal-receiving chamber. Such crystal-growing or crystal-receiving chamber has been provided with vacuum-sealed doors, wherein, after growth the hot crystal may be removed through the front opening door in the crystal-growing chamber.

The present method of handling crystals and removing crystals from crystal-growing furnaces is through opening the door through the crystal-growing or crystal-receiving chamber by an operator and disconnecting the grown crystal from the seed holder, such as by snapping the neck of the crystal by mechanical means, such as by the use of pliers. The hot, heavy crystal is then removed by the operator from the chamber for further manufacturing and processing. Grown crystals, such as of pure silicon, may be grown in various lengths and diameters; for example, from about 100 millimeters or more in diameter and from 10 to 60 inches or more in length, with the neck of the crystal being about 2 to 3 millimeters. The crystal, after grown, often is quite heavy; for example, 50 to 150 pounds. Usually, the door of the crystal-growing chamber is located several feet off the floor and above the chamber in which the crucible is held, and, therefore, must be reached by the operator through the use of a stepladder. Such an arrangement and method are not wholly satisfactory, since the method of handling and removing the crystal requires manual operation of hot and heavy crystal by the operator, with the possibility of damage to the crystal by falling or contacting during the removing and handling. Therefore, it is desirable to provide an effecient and mechanical means and an improved method for handling and removing crystals from crystal-growing furnaces.

SUMMARY OF THE INVENTION

The invention relates to an apparatus for and a method of handling crystals from a crystal-growing furnace, and in particular concerns a system and method for removing efficiently crystals from crystal-growing chambers of crystal-growing furnaces, employing nonmanual, mechanical means and avoiding the problems associated with the prior-art manual handling of crystals.

The invention involves an apparatus for the handling and removing of crystals from a crystal-growing furnace apparatus, which apparatus comprises a lower, evacuated chamber containing a crucible and a melt, and which includes a removable, upper chamber for the growing and receiving of the crystal, with the upper chamber typically being a removable cylinder. Means are provided to isolate the lower furnace chamber from the upper chamber through the use of a vacuum-tight isolation valve or door, prior to removal of the upper chamber. The apparatus also includes means to retain the crystal and to hold the crystal in place, while the upper chamber is removed from the lower chamber, such as, for example, the employment of locking pins which are slidably inserted into the base of the upper chamber, to hold and retain the grown crystal in place within the upper chamber. The apparatus includes means to remove the upper chamber from the lower chamber, after closing of the isolation valve, such as by the use of a derrick or hoist mechanism to swing the upper cylindrical chamber to one side and free and clear of the lower chamber and the furnace.

The invention includes a vehicle or transport mechanism, such as a wheeled cart, containing a lower receiving chamber, such as a cylinder chamber therein which substantially matches the dimensions of the upper chamber, and means to raise and lower a crystal-receiving platform within the lower chamber, such as the use of an elevator mechanism to raise and lower a platform within the cart chamber, so as to permit the weight of the crystals to be transferred from the retaining means of the upper chamber to the raised elevator means in the lower chamber, and the crystal lowered gently into the lower chamber in the cart and the receiving tube therein; thus, providing for an efficient, nonmanual mechanism for removal of hot, massive crystals from crystal-growing furnaces.

The invention resolves the difficult task of removing hot and extremely heavy silicon crystal ingots by a simple mechanical apparatus and process. In the method, once the crystal ingot has been grown and pulled into the upper crystal-growing chamber, the vacuum-tight, isolation valve is closed, in order to seal the lower chamber, and then the upper cylindrical chamber is opened to the atmosphere. A port, such as a quartz window, is provided in the upper chamber, to allow the operator to ensure that the crystal in the upper receiving chamber is clear of the isolation valve. Once the grown crystal is within the receiving chamber, the retaining means are activated, such as special locking pins which are then inserted and slid into the base of the upper chamber. The still-hot crystal in the upper chamber is then lowered by the pulling-head mechanism onto the locking-pin retaining means. The upper chamber is then brought to atmospheric pressure and mechanically disconnected from the isolation valve, and a derrick or hoist means used to lift the assembly from the lower chamber of the furnace. The upper chamber, then containing the retained crystal securely therein, is then swung to one side of the furnace.

The crystal-receiving cart, containing the lower, crystal-receiving chamber, is positioned underneath the upper chamber in its side position, and the receiving tube or chamber in the cart is connected to the bottom of the upper crystal chamber. An elevator mechanism then raises a platform through the bottom of the upper chamber, engaging the bottom of the crystal, after which the locking pins or retaining means are retracted, which permits the weight of the crystal ingot to be taken off the retaining means and to be shifted onto the elevator platform. The elevator mechanism is then activated, to allow the crystal on the platform to descend into the crystal-receiving tube on the cart. The elevator mechanism allows the crystal to be lowered slowly into the lower receiving chamber, so that it cannot be dropped suddenly and become fractured, regardless of whether the seed is still intact. The cart, then containing the crystal secured within the lower crystal-receiving chamber, may be wheeled and removed from the crystal-growing furnace area for processing or use.

The inventive apparatus and method overcome many of the difficulties associated with the prior manual handling of hot massive crystals from crystal-growing furnaces, while avoiding the problems associated with the employment of sealed crystal doors in the upper crystal-receiving chamber.

The invention provides for the easy handling of crystals of great weight, particularly 60 kilograms or higher, and also the handling of hot crystals directly after the growth of the crystals, with minimum danger to personnel. The upper and lower crystal-receiving chambers may be simple, cylindrical tube elements, while the lower crystal-receiving tube merely may be positioned on a cart or on a vehicle which can be wheeled or rolled to another location.

The invention will be described for the purpose of illustration only in connection with certain embodiments; however, it is recognized that persons skilled in the art may make various changes and modifications in the apparatus and method, all without departing from the spirit and scope of the invention.

BRIEF DESCRIPTION OF THE DRAWINGS

FIG. 1 is a schematic, sectional illustration of a crystal-growing furnace apparatus of the invention;

FIG. 2 is a sectional, illustrative view of the crystal-growing furnace apparatus of FIG. 1, with the upper chamber in an offset position over a lower chamber;

FIG. 3 is a sectional, illustrative view of the crystal-growing furnace apparatus of the invention, wherein upper and lower chambers are aligned for transfer of the grown crystal; and FIG. 4 is a sectional, illustrative view showing the transferred grown crystal in the lower chamber.

DESCRIPTION OF THE EMBODIMENTS

FIG. 1 shows the crystal-growing furnace 10 of the invention, with a hoist or derrick 12 adapted to lift and to pivot, a pulling-head mechanism 14 with a chain 32, a removable, cylindrical, crystal-receiving, upper chamber 16 with a quartz port hole 18 therein, and including slidable locking pins 20 shown in the retracted or noncrystal-support position. The lower melt chamber 24 includes a crucible 26 containing a melt 50, for example, of silicone, the crucible supporting on a shaft 30 on a rotatable lift mechanism 28, wherein the crucible may be rotated and raised and lowered to maintain the level of the melt constant. If desired, the shaft 30 and mechanism 28 can extend outside of chamber 24 through a seal in the bottom of chamber 24. Melt chamber 24 and upper chamber 16 are adapted in operation to be maintained under vacuum with an inert gas, such as argon, to provide a contaminant-free atmosphere for growing the crystal from the melt, with the grown crystal 34 grown and received in the upper chamber 16. An isolation valve 22 provides means to isolate, in a vacuum-tight manner, the melt chamber 24 and the upper chamber 16.

FIG. 2 shows the apparatus 10 with the upper crystal-receiving chamber 16 with the pulling-head mechanism 14 raised and pivoted by hoist 12 to one side of the lower melt chamber 24 and free of the melt chamber. The grown crystal is shown supported on slidable locking pin 20 placed in an inward support position, and supporting the grown crystal which has been lowered onto the locking pin 20. The upper chamber 16 has been disconnected from the isolation valve 22 and melt chamber 24 and has the bottom end open.

FIG. 2 also shows a crystal-receiving and transport mechanism 36 comprising a wheeled cart 38, having a chamber support 42 in which rests a separate, upright, cylindrical, lower, crystal-receiving chamber 40, with the upper end open. The upper and lower crystal-receiving chambers 40 and 16 are shown as of the same dimensions, with the chambers 16 and 40 in a spaced-apart, but axially aligned, position. The cart 38 includes a hoist or elevator pulley mechanism, by which the separate, lower chamber 40 may be raised or lowered in support chamber 42. Also, the crystal chamber 40 includes therein an elevator mechanism 46 with raised support bars 44, to support the grown crystal 34, and a platform 48, whereby the platform 48 travels between a lower position as shown and a raised position.

FIG. 3 shows the lower chamber 40, with the open upper end raised by the elevator mechanism, to connect with the open lower end of the chamber 16, and the support bars 44 and platform 48 in the raised position, with the bars 44 now supporting the bottom of the grown crystal 34 in the upper chamber 16, with the locking pin in the retracted position (not shown).

FIG. 4 shows the grown crystal 34 secured within the lower chamber 40, after disconnecting and removing of the upper chamber 16 and the lowering of the crystal 34 by the elevator 46 to the low position. The grown crystal now may be transported in chamber 40 in the transport 36 to the next location for processing or use, while the upper chamber 16 and pulling head 14 are raised, pivoted and lowered back onto the isolation valve 22 and connected to melt chamber 24 for growing another crystal.

In operation, upper chambers 16 and 40 are simple tubes. After the crystal 34 is grown and retained in chamber 16, pulling-head mechanism 14 by chain 32 lowers the crystal 34 onto the locking pin 20 inserted in the support position at the bottom of the chamber 16. Upper chamber 16 is then isolated by closing valve 22 and then opened to the atmosphere. The operator may observe that the crystal 34 is clear of the valve 22 by port hole 18. The upper chamber 16 is then disconnected from isolation valve 22 and melt chamber 24. The hoist 12 then raises the upper chamber 16 and pulling head 14 slightly; for example, 1 to 6 inches, and swings the upper chamber 16 and pulling head 14 to one side over to a clear floor space free of the melt chamber 24 (see FIG. 2).

The transport mechanism 36 is then rolled into position, with the open upper end of separate lower chamber 40 positioned directly under the lower end of upper chamber 16. The lower chamber 40 is raised and connected to the bottom of upper chamber 16. The elevator mechanism 46 inside chamber 40 is raised, so that the support bars 44 on platform 48 are placed in a support position under crystal 34, without interference from locking pin 20 (see FIG. 3). The slidable locking pin 20 is removed to transfer support to support bars 44. The elevator 46 is lowered gently. The chain 32 can be disconnected, after support by locking pin 20 or support bars 44, or can be used to provide additional security, until the crystal 34 is secure in chamber 40; that is, as elevator 46 is lowered, the pulling head is also activated and the crystal lowered, and then chain 32 is disconnected.

The crystal 34 is now securely within lower chamber 44 (see FIG. 4), and the upper chamber 16 is disconnected from the lower chamber 40. The secure crystal now may be rolled away in cart 38.

The apparatus and method described provide an efficient and a safe way to handle and to remove hot massive crystal from a crystal-growing furnace, with minimum danger to personnel and the crystal.

What we claim is:

1. An apparatus for the handling of grown crystals from a crystal-growing furnace apparatus, which apparatus comprises in combination:
   (a) a crystal-growing furnace apparatus which includes:
      (i) a lower melt chamber adapted to provide a contaminant-free atmosphere for the growth of a crystal from a melt,
      (ii) a crucible in the lower chamber to contain a melt,
      (iii) an upper crystal chamber in a crystal-receiving position adapted to receive the grown crystal from the melt in the lower chamber, the upper chamber being removable from the lower melt chamber,
      (iv) means to isolate, in a vacuum-tight manner, upper and lower chambers, to permit the removal of the upper chamber,
      (v) pulling-head means to draw a seeded crystal from the melt in the lower chamber and the grown crystal into the upper chamber,
      (vi) means to transfer the upper crystal chamber between a crystal-receiving position and a crystal-discharging position free of the lower chamber, and
      (vii) means to support and to retain the grown crystal in the upper crystal chamber on transfer thereof;
   (b) a separate, lower crystal chamber adapted to be positioned to receive the grown crystal discharged from the upper crystal chamber;
   (c) elevator means to move between an upper position in the lower chamber and a lower position, to support the discharged crystal in the lower crystal chamber; and
   (d) means to transport the lower chamber to and from the crystal-receiving position.

2. The apparatus of claim 1 wherein the upper and lower crystal-receiving chambers are cylindrical tubes of substantially the same dimensions.

3. The apparatus of claim 1 wherein the means to transfer the upper crystal chamber includes means to lift the upper chamber from a position above the lower melt chamber, after isolation of the melt chamber, and to move the lifted, upper crystal chamber to one or the other side of the crystal-growing furnace and free of the lower melt chamber.

4. The apparatus of claim 1 wherein the upper crystal chamber includes slidable locking-pin means in the lower portion of the chamber, the locking-pin means movable between a support and a retaining position for the grown crystal lowered into the locking pins by the pulling-head means and a withdrawn, nonsupporting position.

5. The apparatus of claim 1 wherein the elevator means includes a crystal-support platform positioned within the lower chamber and movable between an upper and a lower crystal-support position in the lower chamber.

6. The apparatus of claim 1 wherein the means to transport the lower chamber comprises a wheeled vehicle, and includes a means to raise the upper end of the lower crystal chamber to an aligned position with the lower end of the upper crystal chamber, for transfer of the grown crystal from the upper chamber into the lower chamber.

7. An apparatus for the handling of grown crystals from a crystal-growing furnace apparatus, which apparatus comprises in combination:
   (a) a crystal-growing furnace apparatus which includes:
      (i) a lower melt chamber adapted to provide a contaminant-free atmosphere for the growth of a crystal from a melt,
      (ii) a crucible in the lower chamber to contain a melt,
      (iii) an upper, cylindrical crystal chamber secured to and over the lower chamber in a crystal-receiving position, to receive the grown crystal from the melt in the lower chamber, the upper chamber being removable from the lower melt chamber,
      (iv) valve means to isolate, in a vacuum-tight manner, upper and lower chambers, to permit the removal of the upper chamber,
      (v) pulling-head means to draw a seeded crystal along a vertical axis from the melt in the lower chamber and the grown crystal into the upper chamber,
      (vi) means to lift the upper crystal chamber from a position above the lower melt chamber, after isolation of the melt chamber and disconnection of the upper and lower chambers, and to move the lifted, upper crystal chamber to one or the other side of the crystal-growing furnace and free of the lower melt chamber, and
      (vii) means to support and to retain the grown crystal in the upper crystal chamber on transfer thereof, which includes slidable locking-pin means in the lower portion of the upper crystal chamber, the locking-pin means movable between a support and a retaining position for the grown crystal lowered into the locking pins by the pulling-head means and a withdrawn, nonsupporting position;
   (b) a separate, lower, cylindrical crystal chamber adapted to be positioned in a crystal-receiving position, to receive the grown crystal discharged from the upper crystal chamber, the upper and lower crystal-receiving chambers being cylindrical tubes open at one end and of substantially the same dimensions;
   (c) means to connect and disconnect the lower end of the upper crystal chamber and the upper end of the lower crystal chamber;
   (d) elevator means to move between an upper position in the lower chamber and a lower position, to support the discharged crystal in the lower crystal chamber, which includes a crystal-support platform positioned within the lower chamber and movable between an upper and a lower crystal-support position in the lower crystal chamber; and
   (e) means to transport the lower chamber to and from the crystal-receiving position, which comprises a wheeled vehicle and includes a means to raise the upper end of the lower crystal chamber to an aligned position with the lower end of the upper crystal chamber, for connection with the lower end of the upper chamber and for transfer of the grown crystal from the upper chamber into the lower chamber by the elevator means.

8. A method of handling a grown crystal from a Czochralski crystal-growing furnace, which method comprises:

(a) drawing a seeded crystal from a melt in a crucible in a lower melt chamber, having a contaminant-free atmosphere, into an upper crystal-receiving chamber;

(b) supporting the grown crystal in the upper chamber;

(c) sealing the lower melt chamber from the upper chamber;

(d) opening the upper chamber to the atmosphere;

(e) transferring the upper crystal chamber with the supported crystal to a crystal-discharging position free of the lower melt chamber;

(f) positioning a separate, lower, crystal-receiving chamber in a position to receive the supported crystal from the upper crystal chamber;

(g) lowering the crystal from the upper crystal chamber into the lower crystal chamber; and (h) transporting the grown crystal in the lower crystal chamber to a new location.

9. The method of claim 8 which includes, after receipt of the grown crystal in the upper crystal chamber, lowering the crystal to a supported position onto supports in the lower portion of the upper crystal chamber.

10. The method of claim 8 which includes disconnecting the upper crystal chamber from the lower melt chamber, after sealing the lower melt chamber.

11. The method of claim 8 which includes transferring the upper crystal chamber with the supported crystal by lifting the upper crystal chamber from the lower melt chamber, and moving the lifted, upper crystal chamber away from and free of the lower melt chamber.

12. The method of claim 8 which includes raising an open upper end of the separate lower crystal chamber into an aligned, mating, crystal-transfer position with the lower open end of the upper crystal chamber containing the supported crystal.

13. The method of claim 8 which includes lowering the grown crystal into the lower crystal chamber, by supporting the lower end of the crystal at the upper open end of the lower crystal chamber, and gently lowering the supported crystal into the lower crystal chamber, and removing the empty, upper crystal chamber for reuse in the method.

14. The method of claim 8 which includes employing cylindrical tubes of substantially uniform dimensions of length and width as the upper and lower crystal chambers.

15. The method of claim 8 which includes positioning the lower crystal chamber beneath the moved upper crystal chamber employing a wheeled vehicle on which the lower chamber is supported.

16. The method of claim 8 which includes:

(a) raising the lower-positioned crystal chamber;

(b) connecting, in an axially aligned position, the upper end of the lower chamber to the lower end of the upper chamber;

(c) transferring the support of the grown crystal to a movable support in the lower crystal chamber;

(d) lowering the supported crystal fully into the lower crystal chamber; and (e) disconnecting the upper and lower crystal chambers.

17. A method of handling a grown silicon crystal from a Czochralski crystal-growing furnace, which method comprises:

(a) drawing a seeded silicon crystal from a melt in a crucible in a lower melt chamber, having a contaminant-free, vacuum atmosphere, into an upper, removable, cylindrical, crystal-receiving chamber;

(b) supporting the grown crystal in the upper chamber, by lowering the bottom of the crystal onto lower supports in the upper chamber;

(c) sealing the lower melt chamber from the upper chamber;

(d) opening the upper chamber to the atmosphere;

(e) disconnecting the upper chamber from the lower chamber, to provide a lower, open end of the upper chamber;

(f) raising and pivoting the upper crystal chamber with the supported crystal to a crystal-discharging position free of the lower melt chamber;

(g) positioning a separate, supported, cylindrical, lower, crystal-receiving chamber with an upper open end in a position to receive the supported crystal from the upper crystal chamber;

(h) raising the upper end of the lower chamber into a mating, aligned position with the lower open end of the upper chamber;

(i) connecting the open upper and lower ends of the chambers;

(j) lowering the crystal from the upper crystal chamber, by an elevator in the lower chamber, into the lower crystal chamber;

(k) disconnecting the ends of the upper and lower chambers;

(l) transporting the grown crystal in the lower crystal chamber to a new location; and (m) moving the upper chamber back into location for reuse in the crystal-growing furnace.

* * * * *